United States Patent
Zimmer et al.

(10) Patent No.: US 11,214,861 B2
(45) Date of Patent: Jan. 4, 2022

(54) ARRANGEMENT FOR COATING SUBSTRATE SURFACES BY MEANS OF ELECTRIC ARC DISCHARGE

(71) Applicant: Fraunhofer-Gesellschaft zur Foerderung der Angewandten Forschung E.V., Munich (DE)

(72) Inventors: Otmar Zimmer, Dresden (DE); Frank Kaulfuss, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 37 days.

(21) Appl. No.: 16/635,572

(22) PCT Filed: Jul. 2, 2018

(86) PCT No.: PCT/EP2018/067771
§ 371 (c)(1),
(2) Date: Jan. 31, 2020

(87) PCT Pub. No.: WO2019/025098
PCT Pub. Date: Feb. 7, 2019

(65) Prior Publication Data
US 2020/0240002 A1 Jul. 30, 2020

(30) Foreign Application Priority Data

Aug. 2, 2017 (DE) ...................... 10 2017 213 404.6

(51) Int. Cl.
H01J 37/32 (2006.01)
C23C 14/32 (2006.01)
C23C 14/06 (2006.01)

(52) U.S. Cl.
CPC ........ *C23C 14/325* (2013.01); *C23C 14/0641* (2013.01); *H01J 37/32055* (2013.01);
(Continued)

(58) Field of Classification Search
CPC .............. C23C 14/0021; C23C 14/046; C23C 14/0641; C23C 14/325; H01J 37/32055;
(Continued)

(56) References Cited

U.S. PATENT DOCUMENTS 4,839,011 A 6/1989 Ramalingam
5,294,322 A 3/1994 Vetter
(Continued)

FOREIGN PATENT DOCUMENTS

DE 9218712 4/1995
EP 2 123 789 11/2009
(Continued)

OTHER PUBLICATIONS

International Search Report dated Oct. 25, 2018.
(Continued)

*Primary Examiner* — Rodney G McDonald
(74) *Attorney, Agent, or Firm* — Jacobson Holman PLLC

(57) ABSTRACT

The invention relates to an arrangement for coating substrate surfaces by means of electric arc discharge in a vacuum chamber, wherein electric arc discharges between a target (1) which is electrically connected as a cathode and is formed from a metal material are used. Arranged at a distance from the target (1) is an anode (2), with which the electric arc discharges are ignited to form a plasma formed with metal material of the target (1). The target (1) is connected to a first electric power source (3) and the anode (2) to a second electric power source (4), wherein the absolute values of the electric voltages connected to the target (1) and to the anode (2) different from one another.

5 Claims, 4 Drawing Sheets

(52) U.S. Cl.
CPC .... *H01J 37/3255* (2013.01); *H01J 37/32541* (2013.01); *H01J 37/32568* (2013.01); *H01J 37/32614* (2013.01); *H01J 2237/332* (2013.01)

(58) Field of Classification Search
CPC ........... H01J 37/32064; H01J 37/32541; H01J 37/3255; H01J 37/32568; H01J 37/32614; H01J 2237/332
USPC ....................................... 204/192.38, 298.41
See application file for complete search history.

(56) References Cited

U.S. PATENT DOCUMENTS

| | | | | |
|---|---|---|---|---|
| 6,663,755 | B2* | 12/2003 | Gorokhovsky | ....... C23C 14/022 204/192.38 |
| 2004/0016641 | A1 | 1/2004 | Kolpakov | |
| 2005/0003019 | A1 | 1/2005 | Petersen | |
| 2010/0230276 | A1* | 9/2010 | Beilis | ...................... H01J 27/08 204/192.38 |

FOREIGN PATENT DOCUMENTS

| WO | 03/044240 | 5/2003 |
|---|---|---|
| WO | 2008/145459 | 12/2008 |

OTHER PUBLICATIONS

German Office Action.
Kumar et al. Stabilization of cubic phase in AlTiN coatings using anode configuration. International Journal of Refractory Metals and Hard Materials, Elsevier, Amsterdam, Nl. vol. 60, Jul. 2, 2016, pp. 113-117.

* cited by examiner

ARRANGEMENT FOR COATING SUBSTRATE SURFACES BY MEANS OF ELECTRIC ARC DISCHARGE

BACKGROUND ON THE INVENTION

The invention relates to an arrangement for coating substrate surfaces by means of electric arc discharge. In particular coatings formed with nitride, in particular nitridic coatings, can be advantageously formed on surfaces of substrates.

Vacuum arc technology is a standard technology for depositing thin layers. In the industrial sphere, primarily tools are coated thereby. Typical layer systems are nitridic hard materials such as TiN, AlTiN, CrN, AlCrN, inter alia. The coating is carried out in a vacuum within a chamber. With the aid of an electric arc discharge, a usually metallic material of a target connected as a cathode is vaporized and the resulting vapor is simultaneously ionized. The plasma condenses on the surfaces to be coated and forms a tight thin layer. Addition of reactive gases (e.g. nitrogen) results in a chemical reaction between the plasma and the reactive gas and the layer is formed by the reaction products. In this regard, e.g. vaporizing a target composed of titanium in a nitrogen atmosphere produces the hard material titanium nitride as a layer on a surface of a substrate or workpiece.

In order to produce particularly tight, hard layers, a negative electric bias is applied to the component parts to be coated, the charged coating particles being accelerated in the direction of the workpiece surface. The energy of the coating particles upon impingement is crucial for the properties of the growing layer.

However, the effect of the bias voltage, on account of the electric field distribution, is very greatly dependent on the surface geometry of the parts to be coated. Greatly convex geometries (example: cutting edges) lead to great boosts in the electric field. The ion energies in these regions can become extremely high. This can have negative consequences, such as e.g. material removal accompanied by edge rounding and overheating.

On the other hand, in concave regions (e.g. in tool cavities), the electric field can be observed to become attenuated or to totally disappear. The ion energies of the coating particles are comparatively low in these zones; this possibly results in disadvantageous layer properties (e.g. porosity).

A coating technology is sought, therefore, which makes available a coating plasma having sufficiently high energy to coat geometrically complex substrates uniformly and with good quality.

The customary solution for coating geometrically complex substrates is the use of thermal CVD as coating technology. The precursor gas used as a carrier of the layer material can spread unhindered on all sides, even in cavities; the temperature of the workpiece or component part, which temperature is crucial for layer formation, is independent of geometry. An electric bias voltage is not required. However, only a small selection of layer systems is producible using CVD technology. Moreover, the thermal loading of the substrates is extremely high (approximately 1000° C.). As a result, the usability of the method is restricted to a very great extent.

This problem cannot be solved satisfactorily by means of traditional PVD methods according to the prior art. Relevant catalogs and advertising brochures from the coating service providers expressly point out the difficulties in the coating of deep cavities. Conventional practice is a compromise in which process parameters are chosen which give rise to expect layer properties that are acceptable to some degree in the relevant zones. The coating of deep cavities is avoided here from the outset.

A conventional arrangement for forming coatings in a vacuum chamber by means of electric arc discharge is shown in FIG. 1.

In this case, a target 1, which is electrically connected as a cathode, is connected to the negative pole of an electric current source 3. The target 1 is formed from a metal used to form a coating on a surface of a substrate (not shown here). In accordance with the illustration in FIG. 1, the substrate would be arranged above the vertically upper surface of the target 1 and above that surface of an anode 2 which faces in the direction of the substrate. In this case, the anode 2 is connected to the other, that is to say positive, pole of the electric voltage source 3. An electric voltage is thus established between the target 1 and the anode 2 when the electric current source 3 is switched on. As already explained, a reactive gas, such as e.g. nitrogen, can be introduced into the vacuum chamber in the course of carrying out the coating. A coating formed from a chemical reaction product of the metallic target material and the reactive gas can be formed as a result.

In conventional coating installations, the anode 2 is often supplemented or replaced by the anodally connected wall of the vacuum chamber (not shown here).

The fact that cavities are able to be coated satisfactorily using highly ionized plasmas has been demonstrated under laboratory conditions only for special applications in microsystems engineering (e.g. filling trenches in Si with metal as a conductor track). However, the technology used in that case (high-current pulsed arc, HCA, an arc PVD technology using pulsed discharge currents) is very complex and not suitable for industrial tool coatings.

SUMMARY OF THE INVENTION

It is an object of the invention to specify possibilities for forming homogeneous coatings on substrate surfaces with at least almost constant layer thickness, reduced porosity and good adhesion.

This object is achieved according to the invention and advantageous configurations and developments of the invention can be realized with features referred to the claims.

In the arrangement according to the invention for coating substrate surfaces by means of electric arc discharge in a vacuum chamber, electric arc discharges are ignited between a target, which is electrically connected as a cathode and is formed from a metallic material, and an anode, which is arranged at a distance from the target, in order to form a plasma formed with metallic material of the target. The target is connected to a first electric current source and the at least one anode is connected to a second electric current source. In this case, the absolute values of the electric voltages connected to the target and to the anode differ from one another.

Advantageously, a plurality of anodes can be arranged at a distance from one another and in the direction of the respective substrate surface to be coated. They should be connected respectively to a dedicated electric current source, wherein respectively different electric voltage potentials should be applied to the plurality of anodes. In this case, a difference in the positive electric voltage potential between two anodes arranged next to one another of at least 5 V, preferably at least 10 V, should be maintained. The electric voltage potentials at the anodes should increase in the direction of the substrate surface to be coated.

All the electric current sources should be switched on simultaneously.

The at least one anode or a plurality of anodes should be embodied in a ring-shaped fashion, and the target should be arranged in the interior of the ring(s).

That surface of the first anode which faces in the direction of the substrate surface to be coated should project beyond that surface of the target which faces in the direction of the substrate surface to be coated. The distance between the surfaces of the target and the first anode should be at least 5 mm.

The anode(s) embodied in a ring-shaped fashion can be embodied in a conical fashion on their inner side, such that the internal diameter widens conically in the direction of the substrate surface to be coated. This also applies, in particular, to the internal diameters of the ring-shaped anodes arranged one above another, which increase in the direction of the substrate surface to be coated. This increase can be chosen to be progressive or continuous.

The anode(s) can be formed from graphite and/or the inner wall/walls thereof can be provided with a covering, preferably formed from graphite. The coverings should be electrically conductively connected to the anode(s).

For reactive layer formation, at least one reactive gas can be introduced into the vacuum chamber. Said reactive gas can react chemically with the metal forming the plasma, with the result that the coating can be formed with the chemical reaction product.

The target can be formed from a pure metal or with an alloy or element mixture that is preferably selected from AlCr, AlTi, AlTiMg, AlTiSi, AlCrSi, AlCrY, AlCrC, CrTiSi, CrSi, CrCu, CrFeNi, CoCrFeMnNi, CoCrFeNi, CoCrFeCu, TiSi, IrPt, NiCr, NiCrCo, NiCrCoTi, NiCrCoTiAl, NbTiVZrMo, and NiV. Coatings correspondingly obtainable therewith will also be discussed in the description of exemplary embodiments.

The HCA technology already mentioned implies the use of very highly ionized plasmas for coating concave geometries. This approach is also used in the present invention.

In contrast to the HCA technology, which achieves the high ionization directly at the cathode by the use of pulsed electric discharge currents having extremely high peak current intensities (a number of Ka), the proposed solution path uses a traditional DC electric arc discharge with moderate electric discharge currents of from a few tens to a few hundreds of amperes for plasma generation. This ensures the applicability to industrial applications.

However, the increased ion energy has to be made available here in a different way. This is done according to the invention by introducing one or more additional electric anode voltage potentials for the electric arc discharge, which are introduced into the process optionally by means of additional anodes. It thus becomes possible additionally to feed energy to the coating plasma even in regions remote from the cathode and thus to increase excitation and ionization states.

In arc coating installations according to the prior art, as the anode of the plasma-producing electric arc discharge, the complete wall of the coating chamber is typically used as the anode. Since the latter is usually produced from metal, this is a cost-effective and reliable variant. Owing to the large available inner surface of the vacuum chamber, this solution is also relatively insensitive to contamination as long as purely dielectric layers are not deposited.

In the case of the invention, in addition to a first anode, at least one second anode having a second, deviating electric anode voltage potential can be used. Said at least one second anode can be embodied e.g. in direct proximity to the cathode, e.g. as a ring around the target forming the cathode. In addition, a third anode having a third electric anode voltage potential can be used, which is positioned e.g. at a different side of the coating chamber, preferably at a location at which an increased plasma excitation is desirable. If necessary, further additional anodes having further electric anode voltage potentials can be arranged at further locations in the coating chamber. The arrangement can advantageously be implemented such that the highest and most uniform plasma excitation possible can be maintained in the coating zone at the respective surface to be coated. Alternatively, a deliberately non-uniform, e.g. a particularly concentrated, plasma distribution can also be set.

In this case, the electric anode voltage potentials of the additional anodes can be set independently of one another. Depending on the coating task, they can be kept constant, varied during the process (e.g. for optimum deposition of multilayered coatings, or be applied in a pulsed manner).

The effects of the additionally incorporated anode or anodes including the additional electric anode voltage potentials applied thereto consist firstly in the additional coupling of power into the coating plasma, in particular into the metallic fraction of the plasma. Furthermore, a targeted controllability of the spatial plasma excitation in the vacuum chamber results. As a result of the associated increased energies of the coating particles, in many cases the layer quality can be improved or the use of an electric bias voltage can be dispensed with or the latter can be considerably reduced, without having to accept losses in the layer quality. Furthermore, the coatability of surfaces of dielectric materials, e.g. ceramics or plastics, is improved.

In the case of the electric current sources connected to the target and the anode(s), it is advantageous that the electric voltage potentials at target and anode(s) can be controlled or set in each case individually and independently of one another. The electric voltage potentials can be set either by way of the predefinition of a fixed, constant electric voltage or alternatively by way of the predefinition of a fixed, constant electric current. In a process-dependent manner, an electric current intensity is then established in the first case, and an electric voltage value at the corresponding current source in the second case.

The invention can primarily be used in installations for coating tools and component parts with metal or hard material layers. The use of the invention is particularly expedient during the coating of tools and component parts as substrates having a pronounced surface topography, in particular having concave regions (cavities) and convex regions, e.g. cutting edges. This concerns e.g. tools for primary forming or forming, cutting tools or complexly shaped machine parts which are intended to be protected against wear.

DESCRIPTION OF THE DRAWINGS

The invention will be explained in greater detail by way of example below.

In the figures.

DETAILED DESCRIPTION OF THE INVENTION

In the example shown in FIG. 2, and also in the examples described below with regard to FIGS. 3 to 6, the illustration of a substrate surface to be coated, which can be a surface of a workpiece or tool, has been dispensed with. In all the illustrations, however, the respective substrate would be arranged vertically above those surfaces of the respective targets and anodes 2, 5 and 7 which face in the direction of the substrate.

Figure 1:
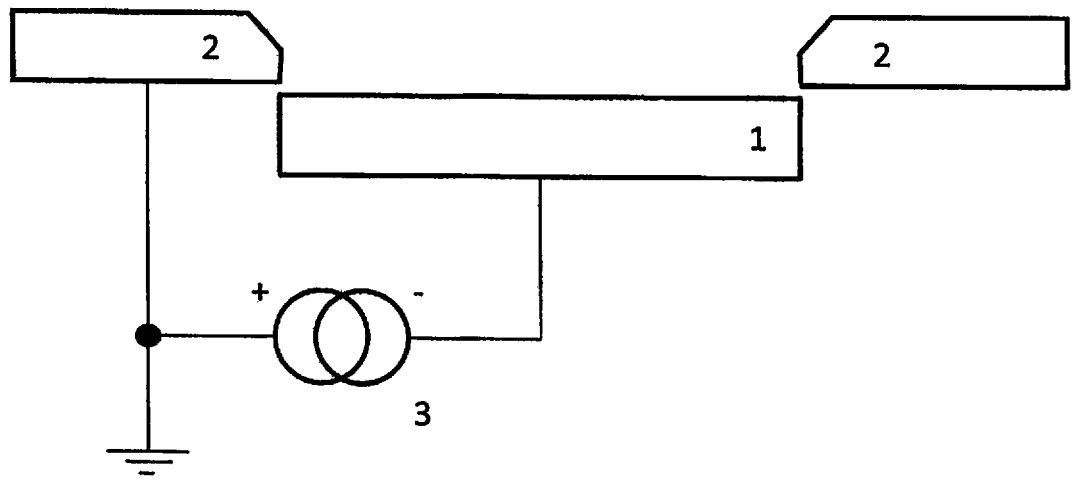
FIG. 1 shows in schematic form an example according to the prior art.
Figure 2:
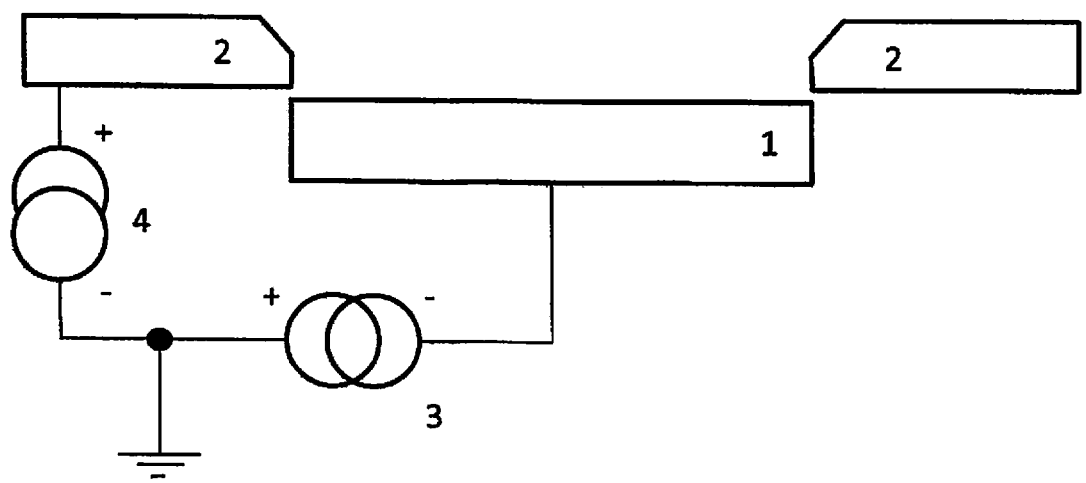
FIG. 2 shows in schematic form a first example of an arrangement according to the invention.

In the example according to FIG. 2, a ring-shaped anode 2 is arranged in relation to a target 1, which is formed as a plate-shaped element made from metallic material, such that the surface thereof facing in the direction of the substrate surface projects beyond the corresponding surface of the substrate.

In this example, the anode 2 can be formed from graphite and is connected to a dedicated electric current source 4. The target 1 has a dedicated electric current source 3, and so in each case different magnitudes of the applied electric voltages can be maintained at the two electric current sources 3 and 4.

Figure 3:
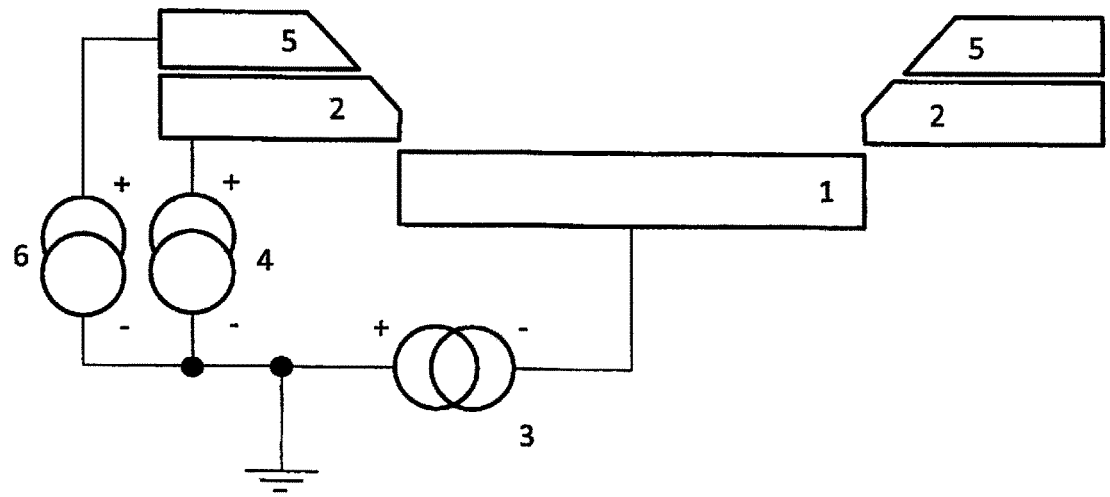
FIG. 3 shows in schematic form a second example of an arrangement according to the invention.

In the example shown in FIG. 3, a second anode 5 is arranged above the first anode 2 in the direction of the side facing the substrate surface to be coated. The second anode 5 is connected to a dedicated electric current source 6, and so in each case a different positive electric voltage potential can be applied to the two anodes 2 and 5 in order that the plasma formed by the electric arc discharge is influenced energetically in a locally defined manner.

Figure 4:
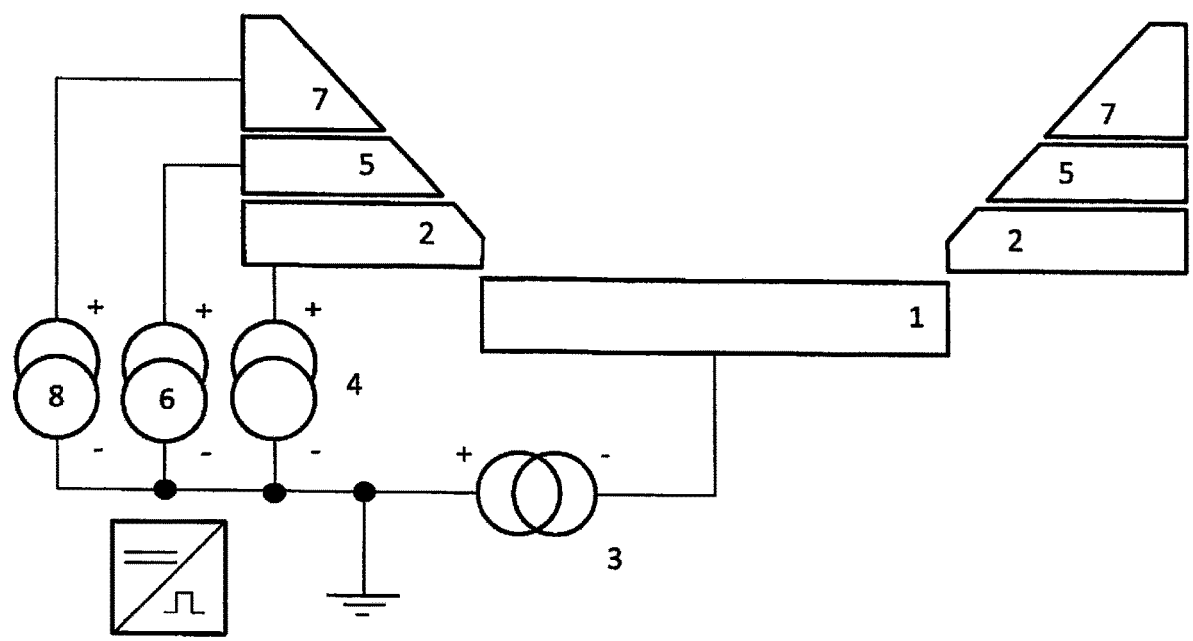
FIG. 4 shows in schematic form a third example of an arrangement according to the invention.

In the example shown in FIG. 4, in contrast to the example according to FIG. 3, a third anode 7 is arranged above the second anode 5 in the direction of the side facing the substrate surface to be coated. This third anode 7, too, is connected to a dedicated electric current source 8, and so in this example, too, in each case a different positive electric voltage potential can be applied to the two anodes 2 and 5.

It becomes clear in these examples that the inner wall of the ring-shaped anodes 2, 5 and 7 can be embodied at least partly in a conical fashion. In this case, the internal diameters can increase in the direction of the substrate surface to be coated.

Figure 5:
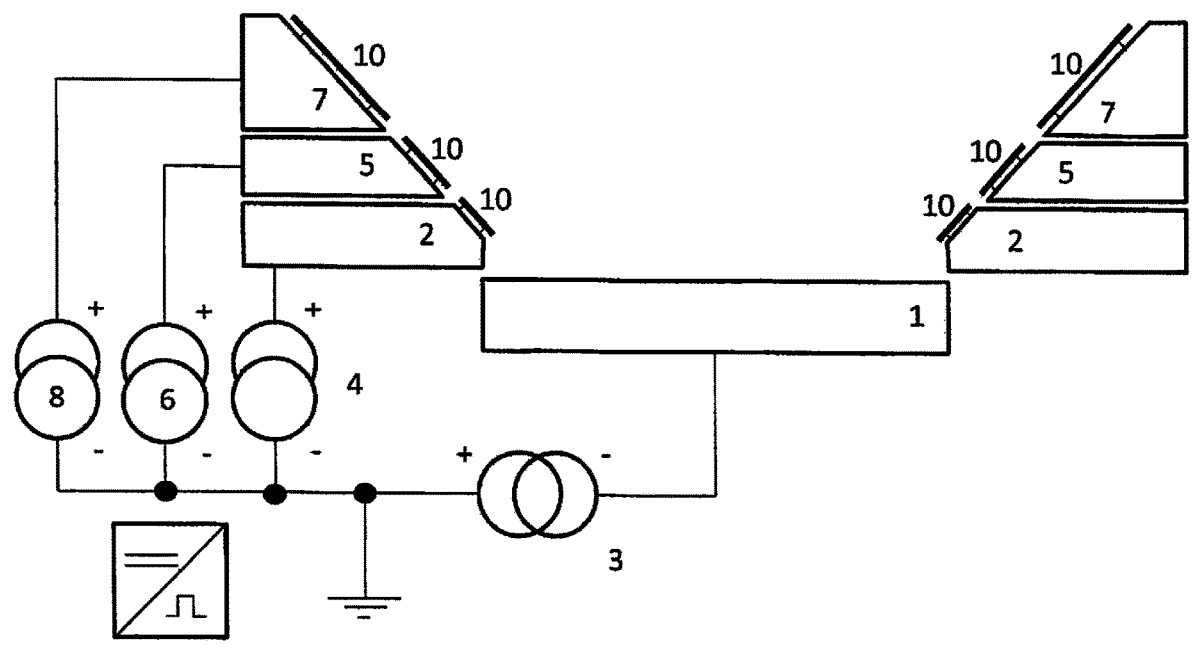
FIG. 5 shows in schematic form a fourth example of an arrangement according to the invention.

The example shown in FIG. 5 differs from the example according to FIG. 4 merely in that a respective covering 10 is arranged on the inner walls of the ring-shaped anodes 2, 5 and 7. The coverings 10 can advantageously consist of graphite. Anodes 2, 5 and 7 formed from metal can be used as a result.

However, such coverings can also be present on anodes in all the other examples shown and described here.

Figure 6:
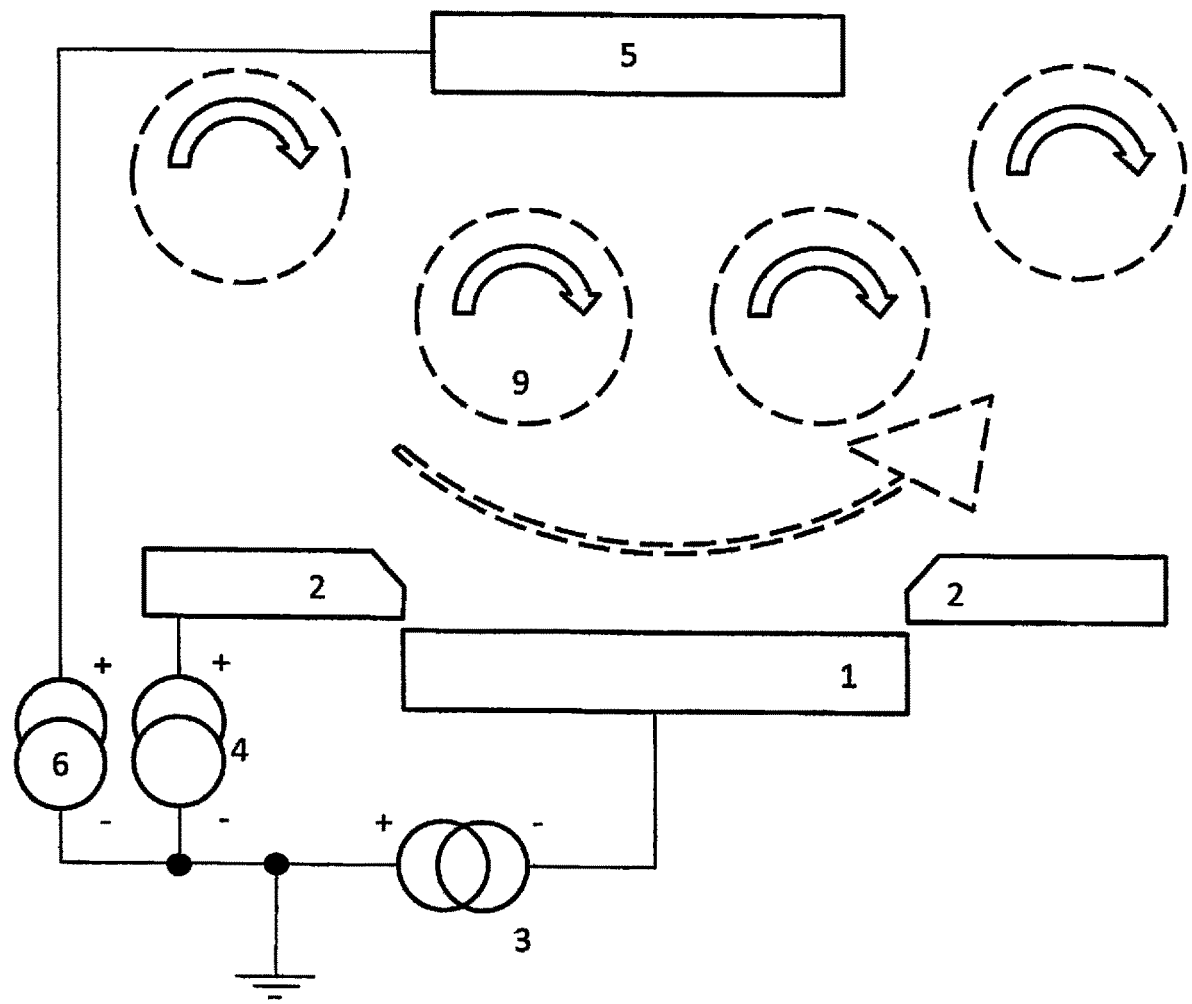
FIG. 6 shows in schematic form a fifth example of an arrangement according to the invention.

In the example shown in FIG. 6, which is based on the example according to FIG. 2, a second anode 5 is embodied as a plate-shaped element and is arranged above the target 1. In this case, the anode 5 can be arranged directly between that surface of the target 1 on which the root of electric arcs runs and the substrate surface to be coated. However, a lateral offset or the use of a plurality of anodes arranged laterally offset is also possible, in a form not illustrated. However, it should be ensured here that the energy of the plasma formed by the electric arc discharge is advantageously influenced in a locally defined manner.

The anode 5 can be cooled and also embodied in a rod-shaped fashion.

Example 1

An arrangement in accordance with FIG. 2 is present, wherein the anode 2 can additionally be covered with a covering 10 composed of graphite in accordance with FIG. 5.

A process in which metallic substrates are coated with an $AlTiO_xN_y$ layer is carried out. Firstly, the substrates are chemically cleaned, dried and arranged on mounts in the vacuum chamber. Evacuation to $10^{-3}$ Pa is followed by ion cleaning using argon ions. The subsequent coating takes place with the use of a target 1, which is connected as a cathode and is a plate composed of AlTi having the composition (66:33 at %). As reactive gases, a mixture of nitrogen and oxygen in a ratio of 70:30% by volume at a pressure of 1 Pa is fed into the vacuum chamber. With an electric discharge current of 100 A at the electric current source 3 and an electric voltage at the target 1, target material is progressively vaporized by means of an electric arc discharge. The electric voltage of the anode current source 4 is set to 30 V. An electric current of approximately 90 A is established there. The electric arc discharge is operated until the desired layer thickness is attained.

As a result, an AlTiOxNy layer having a relatively low proportion of N of approximately 5% has been formed on the substrate surface. The coating is resistant to wear and has a high electrical resistance.

Example 2

An arrangement in accordance with FIG. 5 is used. A process is carried out in which a forming tool having depressions (cavities) is intended to be coated as substrate. The coating is effected with an AlCrSiN layer. Firstly, the tool is chemically cleaned, dried and arranged in the vacuum chamber such that the coating plasma can reach the working surfaces of the tool. Evacuation to $10^{-3}$ Pa is followed by ion cleaning using argon ions. The subsequent coating is carried out with the use of the target 1, which is connected as a cathode and is a plate composed of AlCrSi having the composition (66:29:5 at %). As reactive gas, nitrogen at a pressure of 1 Pa is introduced into the vacuum chamber. With an electric discharge current of 100 A at the current source 3, target material is progressively vaporized by means of an electric arc discharge. The electric voltage of the current source 4 for the first anode 2 is set to 5 V, and the electric voltage at the current source 6, to which the second anode 5 is connected, is set to 30 V. The current source 8 for the third anode 7 is operated in a pulsed manner. Voltage pulses of 100 V having a frequency of 1 kHz and a pulse length of 500 µs are applied in this case. During the coating, the tool to be coated is held at an electric potential (bias voltage) of −10 V with respect to the ground potential.

The electric arc discharge is operated until the desired layer thickness is attained.

As a result, an AlCrSiN layer has been formed on the tool surface. The coating is resistant to wear. It covers the tool surface including the concave regions with a uniform layer of high quality.

Example 3

An arrangement in accordance with FIG. 6 is present. A process is carried out in which complexly shaped tools are intended to be coated. The coating is effected with an AlCrN layer. Firstly, the tools as substrates are chemically cleaned, dried and arranged on rotatable substrate holders (planetary) in the vacuum chamber such that the tools are guided past the target 1, which is connected as a cathode, with constant rotation in three axes. Evacuation to $10^{-3}$ Pa is followed by ion cleaning using argon ions. The subsequent coating is carried out with the use of a plate composed of AlCr having the composition (70:30 at %) as the target 1. As reactive gas, nitrogen at a pressure of 1 Pa is introduced into the vacuum chamber. With an electric discharge current of 100 A at the current source 3, to which the target 1 is connected, target material is progressively vaporized by means of an electric arc discharge. The electric voltage of the current source 4, to which the first anode 2 is connected, is set to 30 V and the electric voltage at the current source 6, to which the second anode 5 is connected, is set to 40 V. During the coating, the tools to be coated are held at an electrical potential (bias voltage) of −10 V with respect to ground potential.

The electric arc discharge is operated until the desired layer thickness is attained.

As a result, an AlCrN layer has arisen on surfaces of the tools. The coating is resistant to wear. It covers the complexly shaped tool surfaces with a uniform layer of high quality.

The invention claimed is:

1. Apparatus for coating substrate surfaces by means of electric arc discharge in a vacuum chamber, wherein electric arc discharges are ignited between a target, which is electrically connected as a cathode and is formed from a metallic material, and at least one anode, which is arranged at a distance from the target, in order to form a plasma formed with metallic material of the target, wherein the target is connected to a first electric current source and the anode is connected to a second electric current source, wherein the absolute values of the electric voltages connected to the target and to the anode differ from one another, wherein a plurality of anodes are arranged at a distance from one another and in a direction of a respective substrate surface to be coated and are connected respectively to a dedicated electric current source, wherein respectively different electric voltage potentials are applied to the anodes, the anodes are located in a ring-shape and are conical at their inner side, so that an internal diameter conically widens in the direction of the substrate surface to be coated.

2. The apparatus as claimed in claim 1, wherein all the electric current sources are switched on simultaneously.

3. The apparatus as claimed in claim 1, wherein that the anodes have inner walls formed from graphite and/or their inner walls provided with a covering formed from graphite.

4. The apparatus as claimed in claim 1, wherein at least one reactive gas is introducible into the vacuum chamber.

5. The apparatus as claimed in claim 1, wherein the target is formed by an alloy selected from a group selected from AlCr, AlTi, AlTiMg, AlTiSi, AlCrSi, AlCrY, AlCrC, CrTiSi, CrSi, CrCu, CrFeNi, CoCrFeMnNi, CoCrFeNi, CoCrFeCu, TiSi, IrPt, NiCr, NiCrCo, NiCrCoTi, NiCrCoTiAl, NbTiVZrMo, or NiV.

* * * * *